(12) United States Patent
Miller et al.

(10) Patent No.: US 7,508,062 B2
(45) Date of Patent: Mar. 24, 2009

(54) PACKAGE CONFIGURATION AND MANUFACTURING METHOD ENABLING THE ADDITION OF DECOUPLING CAPACITORS TO STANDARD PACKAGE DESIGNS

(75) Inventors: Leah Miller, Fremont, CA (US); Ivor Barber, Los Gatos, CA (US); Aritharan Thurairajaratnam, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 505 days.

(21) Appl. No.: 11/078,052

(22) Filed: Mar. 11, 2005

(65) Prior Publication Data

US 2006/0202303 A1     Sep. 14, 2006

(51) Int. Cl.
*H01L 23/053*     (2006.01)
*H01L 23/12*     (2006.01)

(52) U.S. Cl. .............................. 257/700; 257/E23.175; 257/532; 257/698; 174/260; 174/262; 333/22 R

(58) Field of Classification Search ................. 257/532, 257/E23.062, E23.07, E23.079, E23.175, 257/700, 668, 698; 333/22 R, 12; 174/260, 174/262, 565
See application file for complete search history.

(56) References Cited

U.S. PATENT DOCUMENTS

| | | | |
|---|---|---|---|
| 6,198,362 B1 * | 3/2001 | Harada et al. ................. 333/12 |
| 6,469,259 B2 * | 10/2002 | Takeshita et al. ............. 174/261 |
| 6,509,646 B1 * | 1/2003 | Lin et al. ..................... 257/738 |
| 6,680,521 B1 * | 1/2004 | Kar-Roy et al. ............. 257/532 |
| 2003/0006480 A1 * | 1/2003 | Lian et al. .................... 257/532 |
| 2003/0211302 A1 * | 11/2003 | Mandai et al. .............. 428/210 |

OTHER PUBLICATIONS

A. Feingold et al., "Compliant Dielectric and Magnetic Materials for Buried Components", 2002, www.electroscience.com.

* cited by examiner

*Primary Examiner*—Chris C. Chu
(74) *Attorney, Agent, or Firm*—Beyer Law Group LLP

(57) ABSTRACT

The present invention is directed to a method of fabricating an integrated circuit package having decoupling capacitors using a package design conceived for use without decoupling capacitors. The package is implemented with a minimal redesign of the original design and not requiring any redesign of the signal trace pattern. The invention involves replacing top and bottom bond pads with via straps and then covering the top and bottom reference planes with a dielectric layer having conductive vias that electrically connect with the underlying via straps. Planes having the opposite polarity of the underlying reference plane are then formed on the dielectric layer. These planes include an array of bonding pads in registry with the vias. Decoupling capacitors are mounted to the top of the package and electrically connected with the plane on top of the package and the immediately underlying reference plane without the electrical connections to the capacitors passing through the signal planes of the package.

9 Claims, 5 Drawing Sheets

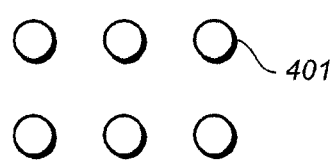
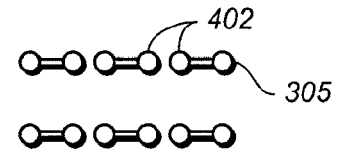
FIG. 4a  FIG. 4b
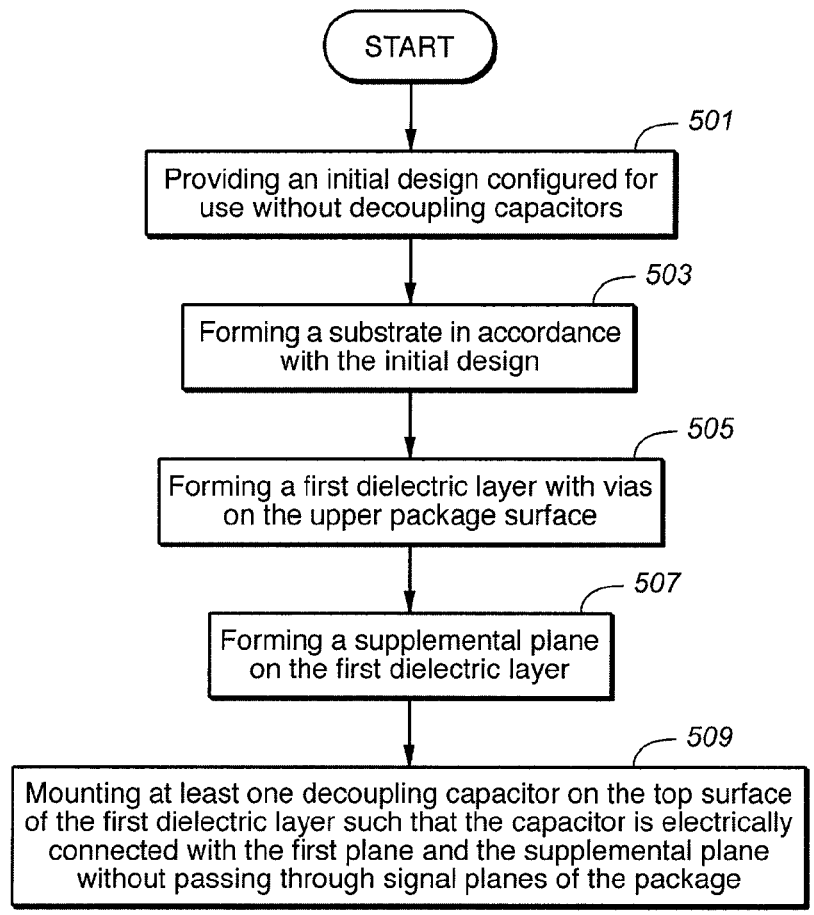
FIG. 5

US 7,508,062 B2

PACKAGE CONFIGURATION AND MANUFACTURING METHOD ENABLING THE ADDITION OF DECOUPLING CAPACITORS TO STANDARD PACKAGE DESIGNS

FIELD OF THE INVENTION

The invention described herein relates generally to semiconductor device packages and the methods of their construction. In particular, the present invention relates to methods and structures used to adapt package designs originally configured for use without decoupling capacitors. More particularly, some embodiments of the invention adapt such package designs in a manner that the addition of decoupling capacitors does not require significant re-routing of electrical traces formed at the signal layers of the package.

BACKGROUND OF THE INVENTION

Decoupling capacitors are usually placed on integrated circuit (IC) packages between external power sources and the delicate circuitry contained in the package. Commonly, such decoupling capacitors are used to buffer the circuitry of the package from power fluctuations common in the external sources. Such fluctuations can be fatal to delicate or less robustly designed circuitry of the package. Decoupling capacitors are useful for ameliorating such effects. Also, decoupling capacitors can provide on package power sources that provide excellent steady state sources of direct current to the circuit elements of the package. Such decoupling capacitors find many other uses that are readily apparent to those of ordinary skill in the art.

However, as appreciated by those having ordinary skill in the art, due to the relatively large size of such decoupling capacitors and the need to make electrical connections to power or ground lines deep within the package, significant alterations must be made in the layout of the signal layers to accommodate the capacitors. Accordingly, the signal trace patterns of the signal layer must be designed with the decoupling capacitors in mind. In current designs, the addition of decoupling capacitors necessitates the crowding of the traces of the signal layers in order to facilitate electrical connections that must pass through the signal layers to connect with underlying layers. Thus, commonly the signal layer layout for a design incorporating decoupling capacitors bears no resemblance to a signal layout designed for use without decoupling capacitors even though both layouts are intended to accomplish exactly the same function. As can readily be appreciated, having two designs required for the same purpose is inefficient and expensive. Moreover, a design initially conceptualized for use without decoupling capacitors cannot be readily or easily converted to add decoupling capacitors at some later time without considerable expense.

The following paragraphs illustrate some further aspects of the problems existing in the current state of the art. Due to the reasons explained above, as well as reasons to be articulated below, the decision as to whether to add decoupling capacitors must be made early in the design process. This can pose a major problem. For example, if a designer or customer desires to make use of a previously tooled or generic package they do not have the option of using decoupling capacitors unless the previously designed package includes decoupling capacitors. The addition of such capacitors is expensive, accordingly such capacitors are only added if absolutely necessary. Additionally, if a package designed for use without decoupling capacitors is used, the cost will be less, but detrimental effects on package performance will be introduced.

FIG. 1 depicts a schematic side sectional view of a six-layer package structure. The depicted package 100 includes six layers 101, 102, 103, 104, 105, 106 arranged in a stripline configuration. Generally speaking, a stripline is package configuration includes a pair of reference planes having at least one signal plane sandwiched therebetween. The reference planes can, for example, be a pair of ground planes or a pair of power planes and can also be a ground plane and a power plane. One such example is depicted by FIG. 1 which depicts stripline 121. The stripline 121 includes a first layer 101 with a ground plane (Vss) 116 and a second layer 102 with a signal plane 114 and a third layer 103 with a power plane (Vdd) 112. The planes are interconnected using a plurality of conductive vias 111. In the depicted embodiment the ground plane 116 includes a plurality of bond pads 119 configured for attachment to other circuit elements of the package. Also, typically the first layer includes a patterned solder mask 118. In the depicted six-layer package, another bottom stripline 122 is depicted.

In existing designs, when a decoupling capacitor is used the capacitor is electrically connected with the top ground plane 116 and also to an underlying power plane 117 (or alternatively 112). This requires that a via be formed that passes through the signal planes 113, 114 to enable such connection. FIGS. 2(*a*) and 2(*b*) illustrate, in simplified depiction, the effects of the via on the pattern of signal traces. FIG. 2(*a*) depicts an example signal trace pattern formed on a signal plane. The dashed line 201 depicts the position of a via for connecting the decoupling capacitor. As can be seen in FIG. 2(*b*), considerable rearrangement of the traces are required to accommodate the via 202. This causes considerable trace crowding and can lead to cross talk between the traces. Also, the close proximity of the traces to the via itself can induce many undesirable effects.

Current solutions to the problem can include complete redesign of the package to add decoupling capacitors. This is particularly time consuming, especially with respect to the redesign of the signal planes which involve a great deal of expensive engineering time in order to achieve. This type of redesign results in greater cross talk between adjacent signal traces and requires redesign of all layers of the package design.

Presently there are no satisfactory processes for converting packages designed for use without decoupling capacitors into packages for use with decoupling capacitors. As stated above, there is a need for process methods for achieving such conversion and also for packages capable of operating with decoupling capacitors and without decoupling capacitors.

SUMMARY OF THE INVENTION

This disclosure describes methods and packages enabling package designs conceived for use without decoupling capacitors to be efficiently reconfigured into designs usable with decoupling capacitors. Embodiments of the invention are directed to integrated circuit packages that are reconfigured from capacitorless designs to form packages that include decoupling capacitors.

In one embodiment, the invention describes an integrated circuit package having decoupling capacitors constructed using a package design configured for use without decoupling capacitors. The package is implemented with a minimal redesign of the original design and not requiring any redesign of the signal trace pattern.

In another embodiment the invention involves an integrated circuit package comprising a multi-layer package substrate configured for use without decoupling capacitors and having a first plane formed on an upper package surface, the plane comprising a ground plane or a power plane. The package includes a dielectric layer formed on the first plane and a supplemental plane formed on the dielectric layer. The supplemental plane having a polarity opposite of the first plane and configured to include a decoupling capacitor that is mounted to the supplemental plane.

In another embodiment the invention involves an integrated circuit package comprising a multi-layer package substrate configured for use without decoupling capacitors and arranged in a stripline configuration with each stripline having at least one signal plane positioned between two reference. The package includes a first dielectric layer on an upper package surface and a second dielectric layer formed on a lower package surface. The package includes a first supplemental plane formed on the first dielectric layer having a polarity opposite of a first plane lying under the first dielectric layer. The first supplemental plane including a decoupling capacitor. The package including a second supplemental plane formed on the second dielectric layer, the second supplemental plane having a polarity opposite of a second plane lying under the second dielectric layer.

In another embodiment the invention describes a method of forming an integrated circuit package with a decoupling capacitor using a package design configured for use without decoupling capacitor. The method involves providing an initial package design configured for a package without decoupling capacitors. A multi-layer package substrate is formed using the initial design incorporating a pair of reference planes and an internal signal plane. Wherein the upper package surface includes a first plane comprising one of the reference planes and an array of bond pads that are electrically connected with the internal signal plane. A first dielectric layer is formed over the upper package surface wherein the first dielectric layer includes an array of conductive vias formed therein, the vias formed in registry with the array of bond pads of the upper package surface. A supplemental plane is formed on the first dielectric layer, the supplemental plane having a polarity opposite of the first plane and further including an array of top bond pads electrically connected with the array of vias, the supplemental plane further configured to facilitate the mounting of a decoupling capacitor. At least one decoupling capacitor is mounted to the package such that the capacitor is electrically connected with the first plane and the supplemental plane.

In another embodiment, a method of forming an integrated circuit package with a decoupling capacitor using a package design configured for use without decoupling capacitor is disclosed. The method includes providing an initial design for an integrated circuit package substrate wherein the initial design is configured for use without decoupling capacitors and wherein the initial design includes a plurality of stripline layers each having a pair of reference planes and at least one signal plane that lies between the reference planes and wherein the package includes upper and lower package surfaces that each have bonding pad arrays arranged to facilitate electrical connection with said signal planes. The initial design is altered to form a modified design where the bonding pad arrays are replaced by corresponding via strap arrays. A first dielectric layer is formed over the upper package surface such that it includes an array of conductive vias electrically connected with the via straps of the upper package surface. A second dielectric layer is formed over the lower package surface such that it includes an array of conductive vias electrically connected with the via straps of the lower package surface. A first supplemental plane including an array of top bond pads is formed on the first dielectric layer, the bond pads arranged in registry with the array of vias, the first supplemental plane is further configured to facilitate the mounting of a decoupling capacitor. A second supplemental plane including an array of bond pads is formed on the second dielectric layer, the second supplemental plane having an array of bottom bond pads arranged in registry with the array of vias of the second supplemental plane. At least one decoupling capacitor is mounted on the first supplemental layer such that electrical connections with the capacitor do not require reconfiguration of electrical trace patterns of the signal planes of the stripline layers.

These and other features and advantages of the present invention are described below with reference to the drawings.

BRIEF DESCRIPTION OF THE DRAWINGS

The following detailed description will be more readily understood in conjunction with the accompanying drawings, in which:

FIGS. 4(a) and 4(b) depict portions of an array of bond pads and an array of associated via straps.

FIG. 5 is a flow diagram illustrating an embodiment of a method of fabricating an IC package in accordance with the principles of the invention.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various integrated circuit packages and method embodiments for constructing such packages will be disclosed.

The inventors, as well as others, have noted that it is very difficult to convert integrated circuit package designs conceived for use without decoupling capacitors into packages capable of implementing decoupling capacitors. The inventors have created a low cost method of constructing such packages using prior designs. The inventors approach is extremely efficient because it does not entail the wholesale redesign of the signal planes which are the most time consuming and expensive of the circuit layers to reconfigure. Additionally, embodiments of the invention require relatively little modification of the reference planes.

Figure 1:
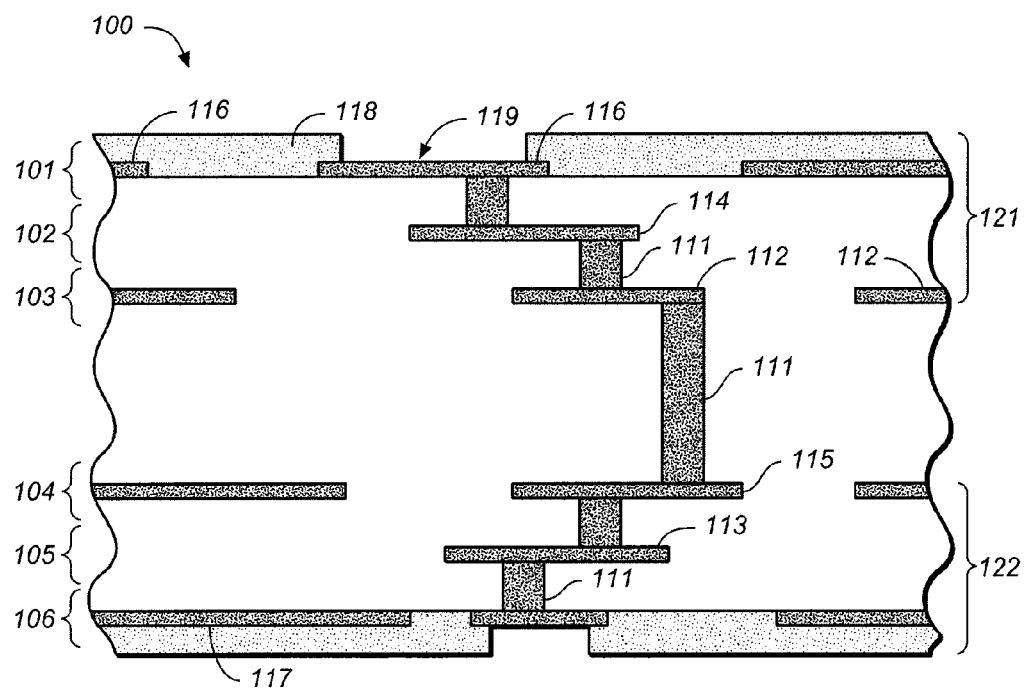
FIG. 1 is a schematic side section view of an existing format for a semiconductor integrated circuit package.
Figure 2A:
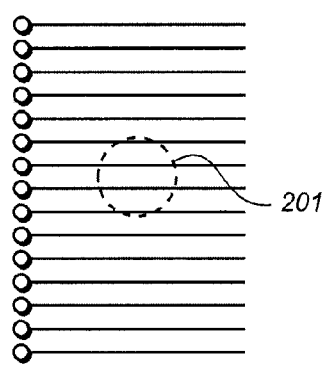
FIGS. 2(a) and 2(b) are simplified views of portions of a signal plane illustrating the crowding effect on the signal traces induced by the presence of large conducting vias needed to establish electrical connection with the reference planes for a decoupling capacitor.
Figure 2B:
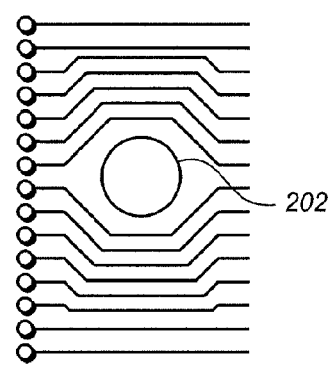

In order to construct embodiments of the invention, the designer begins with an existing design (for example, a design as depicted in FIG. 1) and supplements the package with an added layer on top of the package (more typically two layers are added, one on top and one on bottom). In some embodiments the bond pads on the top and bottom of the package designs can be replaced by via straps which are electrically connected (using vias) to bond pads formed on the added layer. This is useful because the same "footprint" used to layout the pattern of bond pads for the old design is used for the new modified design. The bond pad pattern is simply transferred up to the new top layer which can have the same "footprint" used to lay out the pattern of bond pads for the old top layer. The bond pads are electrically connected with the underlying via straps using vias that pass through the new layer. This feature is particularly advantageous because the same mask pattern that was used to form the bond pads on the old design can be used to form the bond pads on the new top surface. Additionally, an analogous procedure can be employed to form an additional bottom surface.

Figure 3A:
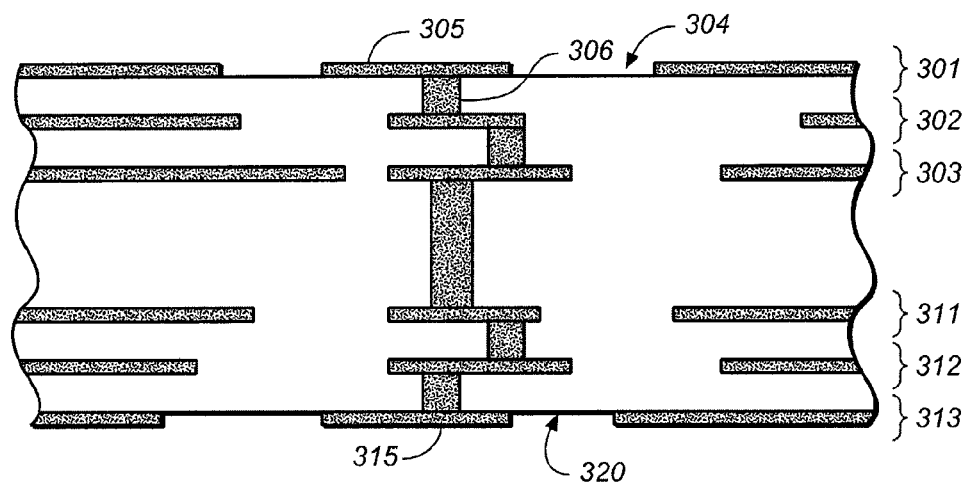
FIGS. 3(a)-3(e) schematically depict side section views of an IC package as it is being processed in accordance with selected embodiments of the invention.

An example process can be illustrated with respect to the following Figures. For example, FIG. 3(a) is a schematic cross-section depiction of an intermediate packaging structure. The depicted example employs a six-layer stripline design having a signal plane 302 sandwiched between a pair of reference planes 301, 303. The signal plane 302 can be replaced with any number of signal planes as dictated by the design. In the depicted embodiment the top reference plane (e.g., a first plane) 301 is formed on an upper surface 304 of the package. In this embodiment the top reference plane 301 is a ground plane (Vss) with reference plane 303 operating as a power plane (Vdd). This structure can be formed by any of a number of manufacturing processes known to those having ordinary skill in the art. The planes are separated by layers of dielectric materials such as BT and the like. The top bond pads can be replaced by a pattern of via straps 305 that are located so that they can electrically connect with the vias 306 that interface with the signal plane 302. Commonly this means that the top bond pads are removed from the design (actually, they are transferred to the supplemental layer) and an alternate mask layer could be used to fabricate the via straps 305. FIGS. 4(a) and 4(b) can be used to provide a further illustration of this principle. FIG. 4(a) depicts a portion of an unmodified reference plane showing some of the bond pads 401. These bond pads would be removed and replaced by an associated array of via straps 402, 305 such as schematically depicted in FIG. 4(b). The via straps are electrically connected to the underlying signal layer using the same vias that the old bond pads did. An analogous process can be repeated for the lower package surface 320. In short, a pair of reference planes 311, 313 sandwich one or more signal planes 312. The bond pads (i.e., ball attachment pads) of the lower surface are replaced by an associated array of via straps 315 that facilitate electrical connection with the underlying signal plane 312.

Figure 3B:
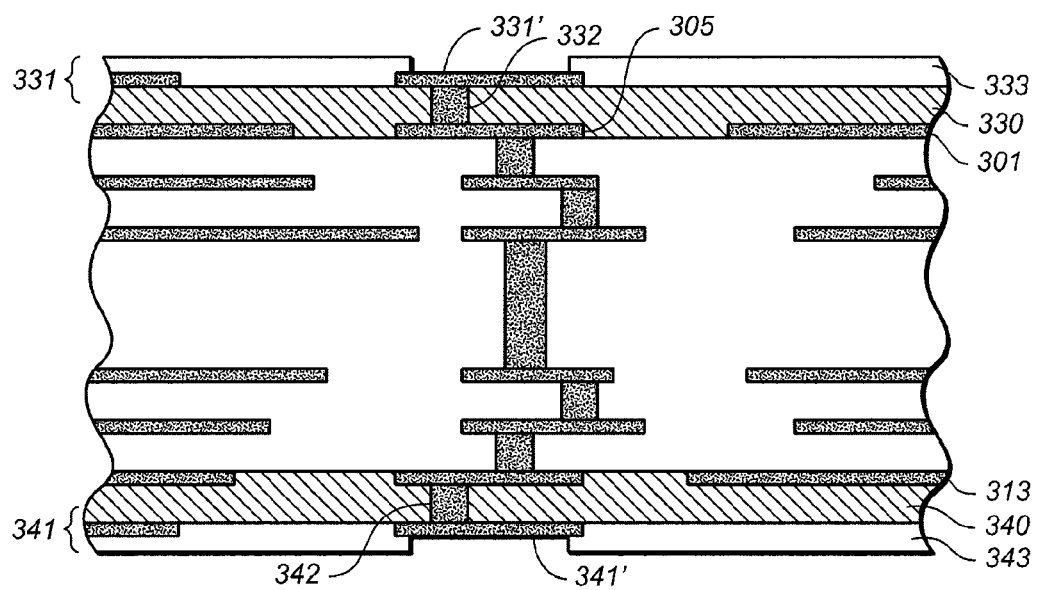

Referring to FIG. 3(b) the upper layer of the package is treated to form a layer of dielectric material 330 into which electrically conductive vias 332 are formed. The layer 330 is typically formed of low-K dielectric materials. However, the inventors contemplate that in some embodiments high-K dielectric materials will also prove useful. The conductive vias 332 facilitate electrical connection between the via straps 305 and a new reference plane 331 (i.e., a supplemental plane) having the opposite polarity of the old reference plane 301. By opposite polarity, it is meant that if the first plane has a first polarity (i.e., one of ground or power) the new supplemental plane has the opposite polarity. For example, in the depicted case, reference plane 301 is a ground plane, therefore the supplemental plane 331 formed on top of the dielectric layer 330 is a power plane. Additionally, solder mask layers 333 or other insulating layers can be used over the top having apertures for the bond pads 331'. Additionally, a via can be formed in the dielectric layer 330 to facilitate electrical connection of a decoupling capacitor with the underlying ground plane 301. Typically, this will include alignment marks and all the usual positioning features normally required for decoupling capacitors. The processes and procedures used to accomplish the formation of this (and other) new layers can be those ordinarily used in the construction of IC packages and need not be described in any great detail here as they are readily apparent to those having ordinary skill in the art.

Still referring to FIG. 3(b), via straps 305 replace the old bond pads and another dielectric layer 340 is formed on the lower surface of the package. Again, electrically conductive vias 342 are formed in the dielectric layer 340 to facilitate electrical connection between the underlying via straps 305 and a new reference plane 341 (i.e., a bottom supplemental plane) formed on the dielectric layer 340. Again, the new reference plane 341 has a polarity opposite that of the old reference plane 313. In this case, plane 331 is a power plane (Vdd), therefore the bottom supplemental plane 341 is a ground plane. Additionally, solder mask layers 343 or other insulating layers can be used over the bottom surface wherein the mask 343 has apertures for the bond pads 341'.

Figure 3C:
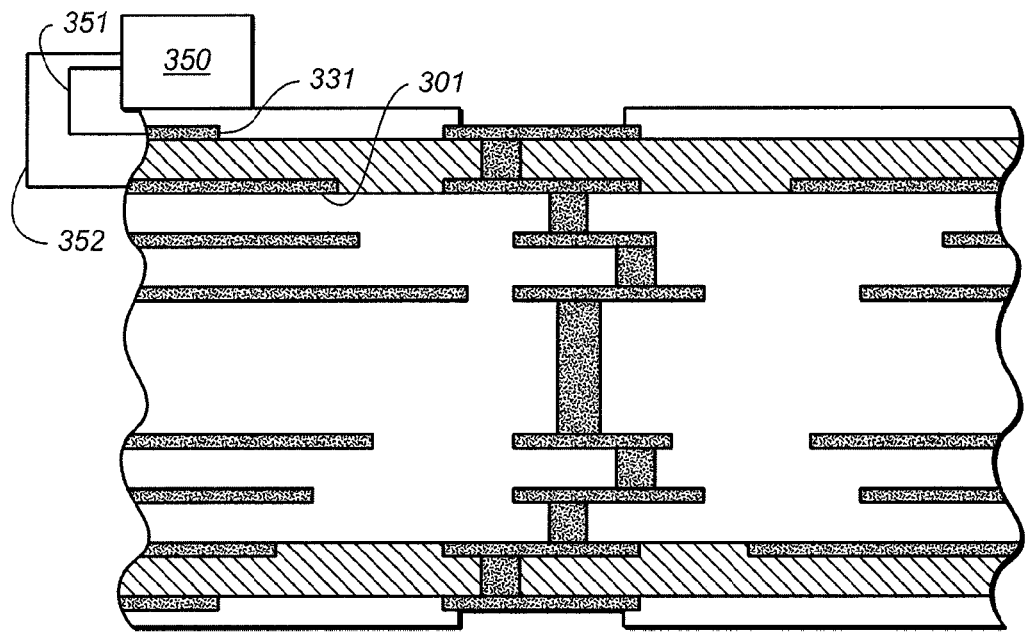
Figure 3D:
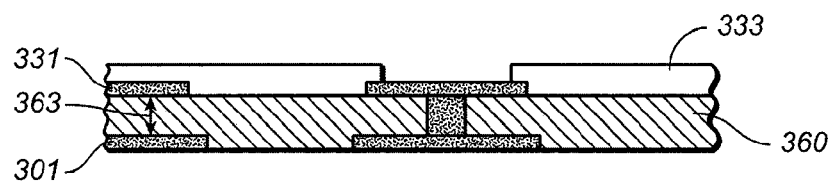
Figure 3E:
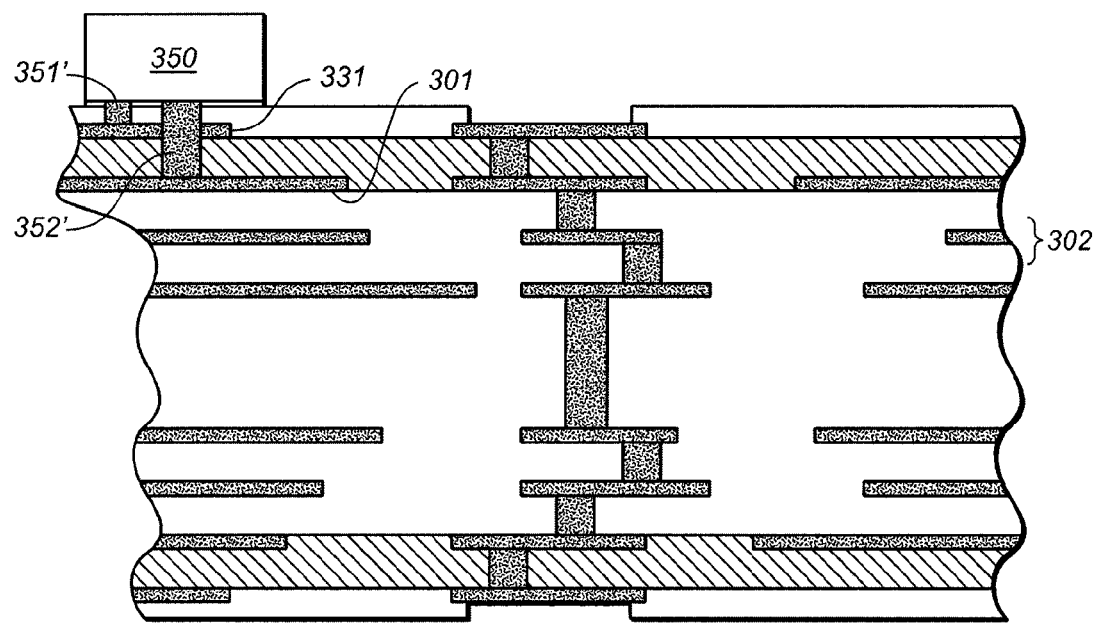

Referring to FIG. 3(c), after completing the bond pad arrays, decoupling capacitors 350 can be added to the package. They are electrically connected with structures 351, 352 to the reference planes 301, 331. For example, conducting vias or bonding wires could be used. Thus, the decoupling capacitors can be added without need for substantial redesign of the package. In particular, the capacitors could be added without the redesign of the signal planes.

One example method embodiment for forming such substrates is illustrated with respect to FIG. 5. Typically, the process begins with a need for a change in the existing design. Thus, an initial design is provided wherein the design is configured for use without decoupling capacitors (Step 501). This design can be used as is with no change in some circumstances. In other words the top and bottom arrays of bond pads are kept as is and the subsequent layers are formed over them and the connections are made to the existing bond pads. However, more typically, the initial design is modified to replace the bonding pads with via straps and formulate new top and bottom bond pad array having pad arrangements configured as in the initial design only on a different layer of the package. The packaging substrate is then fabricated in accordance with the initial design or the modified design (Step 503). This involves forming a top reference plane that includes the array of via straps or bonding pads. The processes used to achieve such manufacture can be those commonly known to those having ordinary skill in the art. Once this initial package substrate is formed, a first dielectric layer is formed on the upper package surface (Step 505). This involves forming a layer of dielectric material over the existing top layer. Vias are formed in the dielectric layer. The vias are typically formed in registry with the underlying via straps or bonding pads. The vias are metallized to establish conductive paths to the underlying via straps or bonding pads. Additionally, a similar process can be used to form an analogous dielectric layer on the bottom surface of the packaging substrate to establish electric contact there. A supplemental plane is formed on a top dielectric layer including an array of bond pads that are electrically connected with underlying via straps or bond pads using the conducting vias (Step 507). The top supplemental plane is further configured to facilitate the mounting of a decoupling capacitor. Additionally, a second supplemental plane can be formed on the bottom dielectric layer with an array of bond pads that are electrically connected, using the conducting vias, with underlying via straps or bond pads of the bottom reference plane. At least one decoupling capacitor is mounted on the top surface of the first dielectric layer such that the capacitor is electrically connected with the underlying reference plane and the supplemental plane (Step 509). The mounting of the capacitor on the top surface of the first dielectric layer is achieved such that the capacitor is electrically connected with the first plane and the supplemental plane without passing through signal planes of the package.

In yet another advantageous implementation, embodiments of the invention can take advantage of other types of capacitive elements to form the decoupling capacitors of the invention. For example, instead of using a low-K dielectric to form the dielectric layer between the reference plane and the supplemental plane a high-K dielectric can be used instead. Instead of merely isolating the reference plane from the supplemental plane the high-K dielectric layer can operate as a capacitive element that decouples the reference plane from the external power sources. Additionally, the high dielectric property of the material in conjunction with a range of dielectric thickness values could be used to achieve the desired level of capacitance.

FIG. 3(*d*) depicts a simplified cross-section view of an upper portion of a package embodiment constructed in accordance with the principles of the invention. The depicted embodiment is similar to that of FIG. 3(*c*) but includes a high-K dielectric layer 360 (in place of the prior low-K dielectric layer 330) that is formed over the reference plane 301 and beneath supplemental layer 331. This high-K dielectric layer 360 can be used to form the decoupling capacitor. The arrows 363 schematically depict a conduction path through the capacitive element between supplemental layer 331 and the reference plane 301. The capacitance formed between reference planes 331 and 301 services the die through connection to the plurality of solder bumps associated with the reference planes.

The methods and materials used in forming such high-K layers and capacitive elements are known to persons having ordinary skill in the art. Particularly suitable materials for constructing such embedded capacitors have dielectric constants of greater than about 20. The inventors contemplate that many different high-K materials could be used. Examples of such high-K dielectric materials include, but are not limited to, HfSiON, ZrO, HfO, $ZrO_2$, $HfO_2$, $CeO_2$, SmO, MgO, HfO, $Y_2O_3$, $Sm_2O_3$, $Pr_2O_3$, $Al_2O_3$, and $Hf_{0.74}Yb_{0.26}O_{1.8}$. Other materials are known to be a useful material for such capacitive layers. However, the capacitance of such layers is determined not only by the material of the capacitive, but is also dependent on the dielectric constant of the materials surrounding the embedded layer. Thus, the precise materials are often a function of design tradeoffs. As is known to persons having ordinary skill in the art, other examples of particularly useful materials are discussed in many papers on the subject. A paper entitled: "Compliant Dielectric and Magnetic Materials for Buried Components" by A. H. Feingold, et al. (See: http://www.electroscience.com/publications/IMAPS2002(2).pdf) discusses several suitable materials.

FIG. 3(*e*) depicts a specific implementation of the substrate shown in FIG. 3(*c*). In adding the decoupling capacitors 350 to the package, they are electrically connected with conducting structures 351, 352 to the reference and supplemental planes 301, 331 respectively. In this depiction, conducting vias 351', 352' are used to electrically connect the decoupling capacitor 350 to the reference plane (i.e., one of $V_{DD}$ or $V_{ss}$) 301 and to the supplemental plane of opposite polarity 331. Thus, where the reference plane 301 operates as the ground plane the supplemental plane 331 of opposite polarity operates as a power plane. Conversely, where the reference plane 301 operates as the power plane the supplemental plane 331 of opposite polarity operates as a ground plane. Thus, the decoupling capacitors can be added without need for substantial redesign of the package. In particular, because the vias 351', 352' do not penetrate past the (former) top layer 301 they do not penetrate into the signal or other underlying layers. Thus, such capacitors can easily added without the redesign of the signal or other underlying planes.

The present invention has been particularly shown and described with respect to certain embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Further, reference in the claims to an element in the singular is not intended to mean "one and only one" unless explicitly stated, but rather, "one or more".

What is claimed is:

1. An integrated circuit package comprising:
    a multi-layer package substrate configured for use without decoupling capacitors and arranged in a stripline configuration with a plurality of striplines, each stripline having at least one signal plane positioned between an associated pair of reference planes, the multi-layer package having an upper package surface and a lower package surface configured so that the upper package surface has a first plane formed thereon wherein the first plane comprises a reference plane of a first stripline and the lower package surface having a second plane formed thereon wherein the second plane comprises one of a reference plane of a second stripline;
    a first dielectric layer formed over the upper package surface and first plane;
    a second dielectric layer formed over the lower package surface and second plane;
    a first supplemental plane formed on a top surface of the first dielectric layer, the first supplemental plane having a polarity opposite of the first plane, the first supplemental plane being configured to include a decoupling capacitor;
    a second supplemental plane formed on a bottom surface of the second dielectric layer, the second supplemental plane having a polarity opposite of the second plane; and
    at least one decoupling capacitive element.

2. An integrated circuit package as in claim 1 wherein the at least one decoupling capacitive element includes a discrete capacitor mounted to the first supplemental plane.

3. An integrated circuit package as in claim 2 wherein:
    the first plane comprises a ground plane of the first stripline
    wherein the second plane comprises a power plane of the second stripline;
    wherein the first supplemental plane comprises a power plane; and
    wherein the second supplemental plane comprises a ground plane.

4. An integrated circuit package as in claim 3 wherein:
the first supplemental plane comprises an array of bond pads for connecting with an integrated circuit die; and
wherein the second supplemental plane comprises an array of bond pads configured for solder ball attachment.

5. An integrated circuit package as in claim 1 wherein the first dielectric layer comprises the at least one decoupling capacitive element and wherein the first dielectric layer comprises a layer of high-K dielectric material.

6. An integrated circuit package as in claim 1 wherein the first dielectric layer comprises the at least one decoupling capacitive element and wherein the first dielectric layer comprises a layer of low-K dielectric material.

7. An integrated circuit package as in claim 1 wherein the striplines each include a plurality of signal layers.

8. The integrated circuit package of claim 1 wherein the first plane includes via straps formed on the upper package layer surface, the via straps are electrically connected with the at least one signal plane of the first stripline by at least one conductive via that passes through a portion of the multi-layer package substrate to connect with the at least one signal plane of the first stripline;

wherein the first supplemental plane includes bond pads that are electrically connected with the via straps of the first plane by conductive vias that pass through the first dielectric layer to connect the bond pads with the via straps;

wherein the second plane includes via straps formed on the lower package layer surface, the via straps are electrically connected with the at least one signal plane of the second stripline by at least one conductive via that passes through a portion of the multi-layer package substrate to connect with the at least one signal plane of the second stripline; and wherein the second supplemental plane includes bond pads that are electrically connected with the via straps of the second plane by conductive vias that pass through the second dielectric layer to connect the bond pads with the via straps.

9. An integrated circuit package as recited in claim 1 wherein said decoupling capacitor of the first supplemental plane includes electrical connections that electrically connect the capacitor to the first plane and to the first supplemental plane in a manner such that the electrical connections do not pass through the signal planes of the substrate.

* * * * *